United States Patent [19]
Ohno et al.

[11] Patent Number: 5,491,034
[45] Date of Patent: Feb. 13, 1996

[54] BONDING WIRE FOR SEMICONDUCTOR ELEMENT

[75] Inventors: Yasuhide Ohno; Yoshio Ohzeki, both of Tokyo, Japan

[73] Assignee: Nippon Steel Corporation, Japan

[21] Appl. No.: 345,351

[22] Filed: Nov. 18, 1994

Related U.S. Application Data

[63] Continuation of Ser. No. 13,665, Jan. 28, 1993, abandoned, which is a continuation of Ser. No. 457,772, Jan. 2, 1990, abandoned.

[30] Foreign Application Priority Data

May 2, 1988 [JP] Japan .................... 63-109587

[51] Int. Cl.$^6$ .................... C22C 5/02; H01L 21/60
[52] U.S. Cl. .................... 428/606; 148/430; 420/507; 420/510
[58] Field of Search .................... 257/784; 420/507, 420/510; 428/606, 620, 672; 148/430

[56] References Cited

U.S. PATENT DOCUMENTS

| | | | |
|---|---|---|---|
| 1,659,757 | 2/1928 | Aderer | 428/672 |
| 2,371,671 | 3/1945 | Blount et al. | 72/366.2 |
| 2,980,998 | 2/1957 | Coleman et al. | 420/510 |
| 4,885,135 | 12/1989 | Hosoda et al. | 428/606 |
| 4,993,622 | 2/1991 | Brook et al. | 228/179 |
| 4,997,723 | 3/1991 | Tanaka | 420/510 |

FOREIGN PATENT DOCUMENTS

| | | |
|---|---|---|
| 0288776 | 11/1988 | European Pat. Off. . |
| 1106967 | 5/1961 | Germany ............ 420/507 |
| 2303519 | 8/1973 | Germany . |
| 201156 | 7/1983 | Germany . |
| 56-13740 | 2/1981 | Japan . |
| 56-76556 | 6/1981 | Japan . |
| 59-119752 | 7/1984 | Japan . |
| 60-15958 | 1/1985 | Japan . |
| 63-145729 | 6/1988 | Japan ............ C22C 5/020 |

OTHER PUBLICATIONS

A. D. Merriman, "A Dictionary of Metallurgy", 1958, p. 390, no month.
Semalloy, "Clad Metals", Technical Bulletin No. CM–64, Jul. 22, 1968, pp. 1–4.
Gehman, "Gold Wire For Automated Bonding," Solid State Technology, Mar. 1980, pp. 84–91.

*Primary Examiner*—John Zimmerman
*Attorney, Agent, or Firm*—Pollock, Vande Sande & Priddy

[57] ABSTRACT

This invention relates to a bonding wire (3) for connecting electrodes of a semiconductor element to outer leads (2). The bonding wire (3) consists of Cu of not less than 1 wt % but less than 5 wt %, and the balance Au and incidental impurities. The bonding wire is superior in rupture strength and bonding strength. Even if the diameter is thinned to about 10 μm, high reliability may be insured for connection.

12 Claims, 1 Drawing Sheet

RELATIONSHIP BETWEEN Cu CONTENT AND PERIOD OF TIME OF HEAT TREATMENT WITH RESPECT TO RUPTURE STRENGTH OF BONDING WIRE

RELATIONSHIP BETWEEN Cu CONTENT AND PERIOD OF TIME OF HEAT TREATMENT WITH RESPECT TO RUPTURE STRENGTH OF BONDING WIRE

5,491,034

BONDING WIRE FOR SEMICONDUCTOR ELEMENT

This is a continuation of U.S. Ser. No. 08/013,665 filed on Jan. 28, 1993, and now abandoned, which in turn was a continuation of U.S. Ser. No. 07/457,772 filed Jan. 2, 1990, and now abandoned.

TECHNICAL FIELD

The present invention of a semiconductor element and external leads to each other.

BACKGROUND OF THE TECHNIQUE

In order to connect electrodes of a semiconductor element to external leads, there has conventionally been used a wire made of Au alloy containing a small amounts of Ca, Be, Ge and etc. in a base of Au which wire has a diameter of 25 to 50 μm, that is, the bonding wire has been used.

When such wire is used for connecting the semiconductor element and a lead frame to each other, such a method has been effected that both components are pressure-bonded through ultrasonic waves, or for the electrodes of the semiconductor element, a hot pressure bonding is effected after each tip thereof has been balled up by arc.

However, it has been recently achieved to make an IC smaller in size and to make the degree of integration thereof higher, with the result that there occurs such problem that, due to an increase in number of electrodes, the electrodes have occupied a too large area in the case of a conventional wire diameter. In order to solve this problem, it is necessary to make the diameter of wire small. However, in the case where the now available wire is made small in size, the wire is apt to rupture to high degree during a wiring operation and the use thereof. Such wire can not be used practically.

For this reason, it has been considered that, regarding the conventional wire, a wire diameter of about 20 μm is the minimum.

There are some attempts to make a wire diameter small as disclosed in Japanese Patent Unexamined Publication Nos. 56-49534 and 56-49535 in which Pt of up to 30 wt % or Pd of up to 40% is added to Au to thereby enhance the strength of the wire and to make the wire diameter small. However, if the content of the alloy elements exceeds a certain limit, there occurs such problem that a hardness of the ball will be increased and a load necessary for hot pressure bonding will be increased with the result that a silicon chip of an IC is apt to be damaged. Japanese Patent Unexamined Publication No. 60-15958 proposes an Au base alloy wire as a bonding wire having a good hot pressure bonding property with respect to electrode wirings in which a different element is mixed into Al. This also suffers the same problem as above. Thus, there is a demand to provide a new bonding wire that is effective for making an IC small in size and densified in a higher degree without any special modification of the conventional IC and a conventional bonding method that have been used.

DISCLOSURE OF INVENTION

An object of the invention is to provide a bonding wire having reliability substantially equal to that of a conventional wire, even if the wire diameter of the bonding wire is made to be smaller that the conventional wire. Also, another object of the invention is to provide a bonding wire for a semiconductor element, which wire can be formed to have an extremely small diameter as well as a sufficiently high strength with respect to the production thereof, which wire and is improved with respect to rupture during the bonding thereof.

BEST MODE FOR CARRYING OUT THE INVENTION

Figure 1:
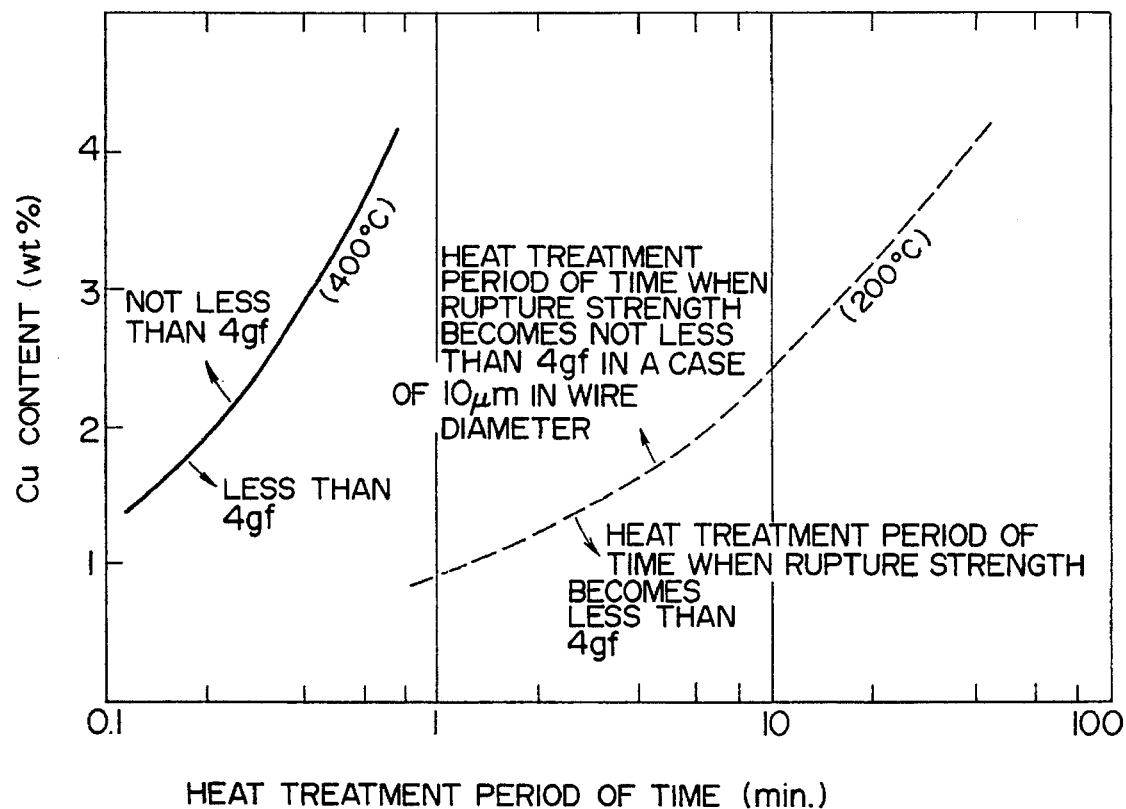
FIG. 1 is a graph in which, regarding a rupture strength of a Cu-containing bonding wire according to the invention, there is shown a relationship between a Cu content and a heat treatment condition.

The features of the bonding wire of the present invention are as follows:

(1) A bonding wire for a semiconductor element consists of Cu of not less than 1 wt % but less than 5 wt % and the balance Au;

(2) A bonding wire for a semiconductor element consists of Cu of not less than 1 wt % but less than 5 wt %, and at least one selected from the group consisting of Ca, Ge, Be, La and In by 0.0003 to 0.01 wt % in total, and the balance Au;

(3) A bonding wire for a semiconductor element consists of Cu not less than 1 wt % but less than 5 wt %, Pt of not less than 1 wt % but less than 5 wt %, and the balance Au; and (4) A bonding wire for a semiconductor element consists of Cu of not less than 1 wt % but less than 5 wt %, Pt of not less than 1 wt % but less than 5 wt %, and at least one selected from the group consisting of Ca, Ge, Be, La and In by 0.0003 to 0.01 wt % in total, and the balance Au.

In the bonding wire for a semiconductor element according to the invention, the reason why Cu is contained in Au by not less than 1 wt % but less than 5 wt % is that Cu completely solid-solutioned into Au enhances not only the strength of the base wire but also the bonding strength, so that it becomes possible to produce a thin wire having a wire diameter of 20 micron or less which wire has been difficult to realize in the prior art and which wire has a rupture strength of 4 grams or more. With respect to this feature, the strength is increased in accordance with the increase of the content of Cu. However, if Cu content exceeds 5%, there occurs a problem in anti-corrosion property, resulting in degradation in reliability after a lapse of long time. Also, when the content of Cu reaches 5%, the hardness of a ball formed during the bonding operation is increased, and a load needed for the hot pressure bonding is increased, with the result that a silicon chip is apt to be damaged.

Since, if a large amount of impurity is contained in Au and Cu used as raw materials, the characteristics of a product will become unstable and this will become a cause of rupture during the production of a thin wire and during bonding operation. Thus, it is preferable to obtain a purity exceeding 99.9%.

It is considered that the reason why such effects may be obtained by the containing of Cu resides in that there occur the solid-solution strengthening and the generation of superlattice. Incidentally, Pt serves to promote the effects. The content of Pt is not less than 1 wt % but less than 5 wt %. If the Pt content is less than the lower limit, the effect can not obtained. If the Pt content is more than the upper limit, there occur defects of the decrease of ductility and the increase in hardness of the ball.

It is preferable to perform a heat treatment at 200° to 600° C. for a suitable period of time in order to insure a suitable ductility and a sufficient strength by relieving working strain occurring during the wire drawing operation.

A thin wire of an as-drawn state has inferior ductility (elongation) and undesirable curls due to the working deformation, so that it is sometimes impossible to use it for practical application. Thus, an annealing operation is usually performed for the wire. In general, the higher the temperature of the heat treatment and the longer the period thereof, the more the strength decreases and the more the ductility increases. However, the degree varies in accordance with the content of the alloy components. Therefore, it is necessary to select the heat treatment condition in accordance with the wire diameter and the composition. Also, the recrystallization of the structure and the grain growth proceed by the heat treatment. If the crystalline grain size approaches the wire diameter, both the strength and ductility are considerably degraded. It is therefore very important to select the heat treatment condition in the case of the thin diameter wire.

FIG. 1 is a graph showing a heat treatment condition for insuring the rupture strength not less than 4 grams in a case of a wire having a diameter of 10 μm and containing Cu. The solid line represents the case of 400° C. treatment and the broken line represents the case of 200° C. treatment.

Also, in particular, the addition of Ca, Be Ge, La and In, which has been added in the conventional gold bonding wire, is effective to enhance the bonding strength of the bonding wire according to the present invention. In order to attain this purpose, it is possible to add at least one selected from these elements by 0.0003 to 0.01 wt % in total.

Regarding the bonding wire according to the present invention, Au alloy having a chemical composition in accordance with the invention is melted in a vacuum melting furnace etc. and is cast. Thereafter, the wire drawing operation, heat treatment and etc. are effected to obtain a wire having a desired wire diameter.

The embodiments for clarifying the advantages of the invention will now be described.

By using a high purity Au having a purity of 99.99% and a high purity Cu having a purity of 99.9%, a material to which the elements shown in Table 1 were added was melted in a vacuum melting furnace. The material was then subjected to a wire drawing and a heat treatment to thereby obtain wires having diameters of 10, 12, 15, 19, 25 and 30 μm.

Figure 2:
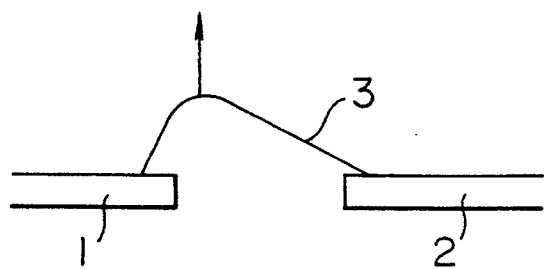
FIG. 2 is an illustration for a method of measuring bonding strength.

In a tensile test, a test piece having a gauge length of 100 mm was used. The bonding strength measurement was conducted in such a manner that the bonding wire 3 connected to both the Si chip 1 and the lead frame 2 as shown in FIG. 2 was tensioned in a direction indicated by the arrow so that the rupture strength was measured. The results of the wire of the invention are shown in Table 1 with respect to rupture load, elongation and rupture strength of the wire after bonding together with the results of comparison materials.

As is apparent from Table 1, it is understood that the wires according to the present invention are superior in rupture strength and bonding strength irrespective of their thin diameters. Also, it is apparent that if the bonding wires having the same diameter as that of the conventional bonding wires are used, the wire having a higher strength may be obtained in the case of the invention.

TABLE 1

| | Chemical composition (wt %) | | | | | | | Wire diameter | Tensile test | | Rupture strength after bonding | Heat treatment |
| | | | | | | | | | Rupture | Elongation | | |
| | Au | Cu | Pt | Ca | Ga | Be | La | In | (μm) | strength | (%) | (g) | condition |
|---|---|---|---|---|---|---|---|---|---|---|---|---|---|
| Example of the Invention 1 | Balance | 1 | 1 | | | | | | 10 | 4.1 | 1 | 1.3 | 200° C. × 1 min. |
| Example of the Invention 2 | Balance | 1.2 | 1 | | | | | | 10 | 4.4 | 4 | 2.8 | 200° C. × 5 min. |
| Example of the Invention 3 | Balance | 2 | | 0.0004 | | | | | 10 | 4.3 | 6 | 2.3 | " |
| Example of the Invention 4 | Balance | 2 | | 0.0008 | | 0.0014 | | 0.0024 | 10 | 4.2 | 5 | 3.6 | 400° C. × 10 sec. |
| Example of the Invention 5 | Balance | 3 | | | | | | | 10 | 4.7 | 12 | 3.8 | 200° C. × 15 min. |
| Example of the Invention 6 | Balance | 4 | | | 0.0042 | | | | 10 | 6.4 | 9 | 4.1 | " |
| Example of the Invention 7 | Balance | 4 | 2 | 0.0011 | 0.0042 | 0.0018 | 0.0014 | 0.0012 | 10 | 7.2 | 7 | 4.4 | " |
| Example of the Invention | Balance | 2 | 4 | | | 0.0028 | | | 15 | 12.2 | 3 | 4.7 | " |

TABLE 1-continued

|  | Chemical composition (wt %) | | | | | | | | Wire diameter (μm) | Tensile test | | Rupture strength after bonding (g) | Heat treatment condition |
|  | Au | Cu | Pt | Ca | Ga | Be | La | In | | Rupture strength | Elongation (%) | | |
|---|---|---|---|---|---|---|---|---|---|---|---|---|---|
| 8 Example of the Invention | Balance | 2 | | 0.0004 | | | 0.0012 | | 15 | 10.5 | 3 | 4.9 | " |
| 9 Example of the Invention | Balance | 2 | 3 | | | | | | 19 | 17.4 | 11 | 5.4 | 220° C. × 15 min. |
| 10 Example of the Invention | Balance | 2 | 3 | | | 0.0062 | | | 19 | 17.4 | 11 | 5.4 | 220° C. × 15 min. |
| 11 Example of the Invention | Balance | 2 | | | 0.0028 | | | | 15 | 10.2 | 3 | 4.7 | " |
| 12 Example of the Invention | Balance | 2 | | | | 0.0022 | | | 25 | 19.3 | 8 | 6.7 | " |
| 13 Example of the Invention | Balance | 2 | | | | | | 0.0043 | 30 | 24.4 | 5 | 10.2 | " |
| 14 Example of the Invention | Balance | 3 | | | | | | | 15 | 13.2 | 4 | 6.8 | 450° C. × 5 sec. |
| 15 Example of the Invention | Balance | 3 | | 0.0008 | 0.0021 | | 0.0013 | | 19 | 17.3 | 5 | 8.7 | " |
| 16 Example of the Invention | Balance | 3 | | | 0.0033 | | | | 30 | 41.2 | 9 | 12.8 | 550° C. × 2 sec. |
| 17 Example of the Invention | Balance | 4 | | | | | | | 30 | 46.8 | 12 | 11.3 | " |
| 18 Comparison material | Balance | | | 0.0010 | | | | 0.0025 | 25 | 7.4 | 7 | 3.6 | 200° C. × 5 min. |
| 2 Comparison material | Balance | | | " | | | | " | 10 | 1.2 | 5 | 1.0 | " |
| 3 Comparison material | Balance | | | | 0.0015 | 0.0008 | | | 25 | 8.1 | 6 | 4.3 | " |
| 4 Comparison material | Balance | | | | " | " | | | 12 | 2.1 | 5 | 1.3 | " |
| 5 Comparison material | Balance | 0.7 | | | | | | | 10 | 2.8 | 2 | 1.1 | 200° C. × 1 min. |
| 6 Comparison material | Balance | 5.5 | | | | | | | 25 | 19.7 | 11 | *7.2 | 220° C. × 10 min. |
| 7 Comparison material | Balance | 1 | 6 | | | | | | 25 | 21.8 | 2 | *9.6 | 220° C. × 15 min. |

*: Damage was observed in IC chip after bonding

Industrial Applicability

As described above, the wire according to the invention is superior in rupture strength and bonding strength. In particular, even if the wire is thinned to 10 micron meters, the wire according to the invention insures a higher reliability than that of the conventional wire and is effective for making highly integrated LSI small in size.

We claim:

1. A bonding wire for a semiconductor element, consisting of Cu of not less than 1 weight % but less than 5 weight %, at least one member selected from the group consisting of Ca, Ge, Be, La and In in an amount of 0.0003 to 0.01 weight % in total, and the balance Au, and having a purity of at least 99.9%, and wherein the diameter of the wire is not greater than 15 μm and having a rupture strength not less than 4 grams.

2. A bonding wire for a semiconductor element, consisting of Cu of not less than 1 weight % but less than 5 weight %, Pt of not less than 1 weight % but less than 5 weight %, and the balance of Au, and having a purity of at least 99.9%, and wherein the diameter of said wire is not greater than 20 μm.

3. A bonding wire according to claim 2, wherein the diameter is not greater than 15 μm and having a rupture strength of not less than 4 grams.

4. A bonding wire for a semiconductor element, consisting of Cu of not less than 1 weight % but less than 5 weight %, Pt of not less than 1 weight % but less than 5 weight %, and the balance of Au, and having a purity of at least 99.9%, and wherein said wire has a rupture strength of not less than 4 grams.

5. A bonding wire for a semiconductor element, according to claim 4, wherein the diameter of the wire is not greater than 20 μm.

6. A bonding wire for a semiconductor element, consisting of Cu of not less than 3 weight % but less than 5 weight %, and the balance Au, and having a purity of at least 99.9%.

7. A bonding wire according to claim 6, having a rupture strength not less than 4 grams.

8. A bonding wire according to claim 6 wherein the diameter of the wire is not greater than 15 um and having a rupture strength not less than 4 grams.

9. A bonding wire according to claim 6 having a wire diameter not greater than 20 μm.

10. A bonding wire for a semiconductor element, consisting of Cu of not less than 1 weight % but less than 5 weight %, Pt of not less than 1 weight % but less than 5 weight %, at least one selected from the group consisting of Ca, Ge, Be, La and In in an amount of 0.0003 to 0.01 weight % in total, and the balance Au, and having a purity of at least 99.9%, and wherein the diameter of the wire is not greater than 20 μm.

11. A bonding wire for a semiconductor element, consisting of Cu of not less than 1 weight % but less than 5 weight %, Pt of not less than 1 weight % but less than 5 weight %, at least one selected from the group consisting of Ca, Ge, Be, La and In in an amount of 0.0003 to 0.01 weight % in total, and the balance Au, and having a purity of at least 99.9%, and wherein the wire has a rupture strength of not less than 4 grams.

12. A bonding wire according to claim 11 wherein the diameter of the wire is not greater than 15 μm.

* * * * *